US008853519B2

(12) United States Patent
Iwai

(10) Patent No.: US 8,853,519 B2
(45) Date of Patent: Oct. 7, 2014

(54) THERMOELECTRIC CONVERSION DEVICE AND METHOD OF MANUFACTURING THE SAME, AND ELECTRONIC APPARATUS

(75) Inventor: Taisuke Iwai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 13/116,663

(22) Filed: May 26, 2011

(65) Prior Publication Data

US 2011/0284049 A1    Nov. 24, 2011

Related U.S. Application Data

(63) Continuation of application No. PCT/JP2008/073813, filed on Dec. 26, 2008.

(51) Int. Cl.
| | | |
|---|---|---|
| H01L 35/18 | (2006.01) | |
| H01L 31/18 | (2006.01) | |
| H01L 35/02 | (2006.01) | |
| H01L 35/32 | (2006.01) | |
| H01L 35/26 | (2006.01) | |

(52) U.S. Cl.
CPC ............... *H01L 35/26* (2013.01); *H01L 35/32* (2013.01)
USPC ............. 136/240; 136/200; 136/201; 438/54; 257/E31.001

(58) Field of Classification Search
CPC ......... H01L 35/00; H01L 35/01; H01L 29/06; H01L 35/18; H01L 35/02; H01L 35/32; H01L 35/26; H01L 31/18
USPC ....................................................... 136/240
See application file for complete search history.

(56) References Cited

U.S. PATENT DOCUMENTS

| | | | |
|---|---|---|---|
| 6,323,414 B1 * | 11/2001 | Shakouri et al. ............... 136/205 |
| 2003/0099279 A1 | 5/2003 | Venkatasubramanian et al. |
| 2004/0079408 A1 * | 4/2004 | Fetzer et al. ................... 136/262 |
| 2006/0102224 A1 | 5/2006 | Chen et al. |
| 2006/0237710 A1 * | 10/2006 | Kitatani et al. ................. 257/12 |

FOREIGN PATENT DOCUMENTS

| | | |
|---|---|---|
| JP | 10-070315 A | 3/1998 |
| JP | 2000-269561 A | 9/2000 |

(Continued)

OTHER PUBLICATIONS

Band Parameter Calculator for III-V Compound Semiconductor, Mar. 25, 2007, http://www.ntu.edu.sg/home/etmei/Subpages/Resource%20for%20Download.htm, Available from www.archive.org.*

A. S. Kindyak, "Nonlinear surface magnetostatic waves in a ferrite semiconductor structure", Technical Physics, vol. 44, No. 6, (1999), pp. 715-717.*

(Continued)

*Primary Examiner* — Jeffrey T Barton
*Assistant Examiner* — Tae-Sik Kang
(74) *Attorney, Agent, or Firm* — Westerman, Hattori, Daniels & Adrian, LLP

(57) ABSTRACT

In order to achieve a thermoelectric transducer exhibiting a higher conversion efficiency and an electronic apparatus including such a thermoelectric transducer, a thermoelectric conversion device is provided, including a semiconductor stacked structure including semiconductor layers stacked with each other, the semiconductor layers being made from different semiconductor materials, in which a material and a composition of each semiconductor layer in the semiconductor stacked structure are selected so as to avoid conduction-band or valence-band discontinuity.

15 Claims, 14 Drawing Sheets

(56) References Cited

FOREIGN PATENT DOCUMENTS

| JP | 2000-299504 A | 10/2000 |
| JP | 2004-193200 A | 7/2004 |
| JP | 2005-506693 A | 3/2005 |
| JP | 2006-269818 A | 10/2006 |
| JP | 2008-523579 A | 7/2008 |
| WO | 03/032408 A1 | 4/2003 |

OTHER PUBLICATIONS

S. Sano; "Development of High-Efficiency Thermoelectric Conversion Module System", Engineering Advancement Association of Japan Thermoelectric Power Generation Forum, Oct. 31, 2005.

International Search Report for PCT/JP2008/073813, mailed on Feb. 10, 2009.

Japanese Office Action dated Feb. 19, 2013, issued in corresponding Japanese Patent Application No. 2010-543723, w/ English translation.

* cited by examiner

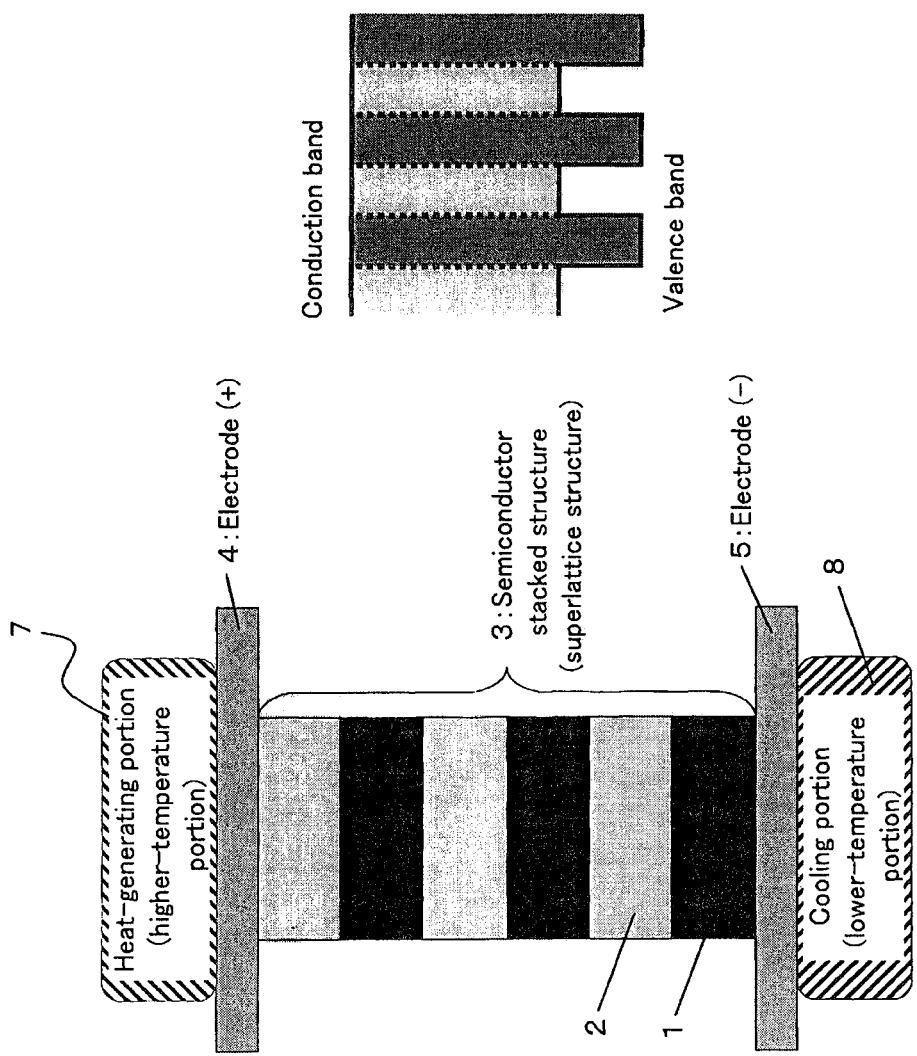
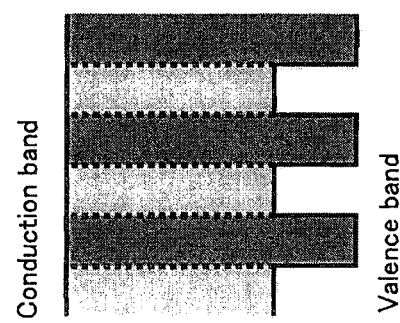
FIG. 1A
FIG. 1B

ΔEv = 0
Band structure

US 8,853,519 B2

THERMOELECTRIC CONVERSION DEVICE AND METHOD OF MANUFACTURING THE SAME, AND ELECTRONIC APPARATUS

CROSS-REFERENCE TO RELATED APPLICATION

This application is a continuation Application of a PCT international application No. PCT/JP2008/073813 filed on Dec. 26, 2008 in Japan, the entire contents of which are incorporated by reference.

FIELD

The embodiments discussed herein are related to a thermoelectric conversion device and a method of manufacturing the same, and an electronic apparatus.

BACKGROUND

Thermoelectric conversion devices employing the Seebeck effect can recycle waste heat, and thus have become a focus of attention as an ecologically-friendly energy conservation technique.

As depicted in FIG. 14, a conventional thermoelectric conversion device has a structure having electrodes made from a conductive material provided on a higher-temperature side insulating material, electrodes made from a conductive material provided on a lower-temperature side insulating material, p-type semiconductor components made from a single material and n-type semiconductor components made from a single material, provided between the electrodes, for example. See Seijiro Sano, *Development of Higher-efficiency Thermoelectric Conversion Module Systems*, Thermoelectric Generation Forum, Oct. 31, 2005, p.p. 15-16, Engineering Advancement Association of Japan, the entire content of which is incorporated herein by reference.

SUMMARY

Accordingly, a thermoelectric conversion device includes: a semiconductor stacked structure including semiconductor layers stacked with each other, the semiconductor layers being made from different semiconductor materials, wherein a material and a composition of each semiconductor layer in the semiconductor stacked structure are selected so as to avoid conduction-band or valence-band discontinuity.

Furthermore, an electronic apparatus includes: the above-described thermoelectric conversion device; a heat-generating portion; and a cooling portion.

Furthermore, a method of manufacturing a thermoelectric conversion device includes: forming a semiconductor stacked structure by stacking a first semiconductor layer and a second semiconductor layer alternate over a semiconductor substrate, materials and compositions of the first and second semiconductor layers being selected so as to avoid conduction-band or valence-band discontinuity; and forming an upper electrode over an upper face of the semiconductor stacked structure and forming a lower electrode over a back face of the semiconductor substrate.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF THE DRAWINGS

FIG. 1A is a schematic view illustrating the configuration of a thermoelectric conversion device according to a first embodiment;

FIG. 1B is a diagram illustrating the band structure of the semiconductor stacked structure constructing the thermoelectric conversion device in FIG. 1A;

DESCRIPTION OF EMBODIMENTS

Although larger or smaller thermoelectric conversion devices, such as those used for power plants or wrist watches, are in actual use, practical utilization of thermoelectric conversion devices in middle power ranges, ranging from about milli watts to about kilo watts, still remains difficult.

This is attributed to low conversion efficiencies of such middle-range thermoelectric conversion devices.

The figure of merit ZT, which is used as a performance indicator of a thermoelectric material (indicator of the conversion efficiency), is expressed in the following formula:

$$ZT = \alpha^2 \sigma T / X, Z \propto m^* \mu / X$$

where T is the temperature, α is the Seebeck coefficient, σ represents the electrical conductivity, X represents the thermal conductivity, m* represents the effective mass, and μ represents the mobility.

Thus, increasing the electrical conductivity σ while reducing the thermal conductivity X can provide a higher figure of merit ZT.

The electrical conductivity σ, however, is generally directly proportional to the thermal conductivity X in a conventional thermoelectric material, such as in semiconductor material used in a thermoelectric conversion device. On the other hand, the effective mass m* is generally inversely proportional to the mobility μ.

For the above reason, it is very difficult to obtain an increased figure of merit ZT in thermoelectric conversion devices utilizing a conventional single material, resulting in hindering development of thermoelectric conversion devices with higher conversion efficiencies.

Accordingly, there is a need for a thermoelectric conversion device exhibiting a higher conversion efficiency and an electronic apparatus including such a thermoelectric conversion device.

Hereinafter, a thermoelectric conversion device and a method of manufacturing the same according to embodiments will be described with reference to the drawings.

First Embodiment

A thermoelectric conversion device and a method of manufacturing the same according to a first embodiment will be described with reference to FIGS. 1A-5.

As depicted in FIG. 1A, the thermoelectric conversion device according to the present embodiment includes a semiconductor stacked structure 3 formed by stacking a plurality of semiconductor layers 1 and 2 made from different semiconductor materials, and a positive electrode 4 and a negative electrode 5 provided above and below the semiconductor stacked structure 3 in the stacking direction, respectively, sandwiching the semiconductor stacked structure 3. That is, the positive electrode 4 is provided above the top of the semiconductor stacked structure, and the negative electrode 5 is provided blow the bottom of the semiconductor stacked structure.

Figure 5:
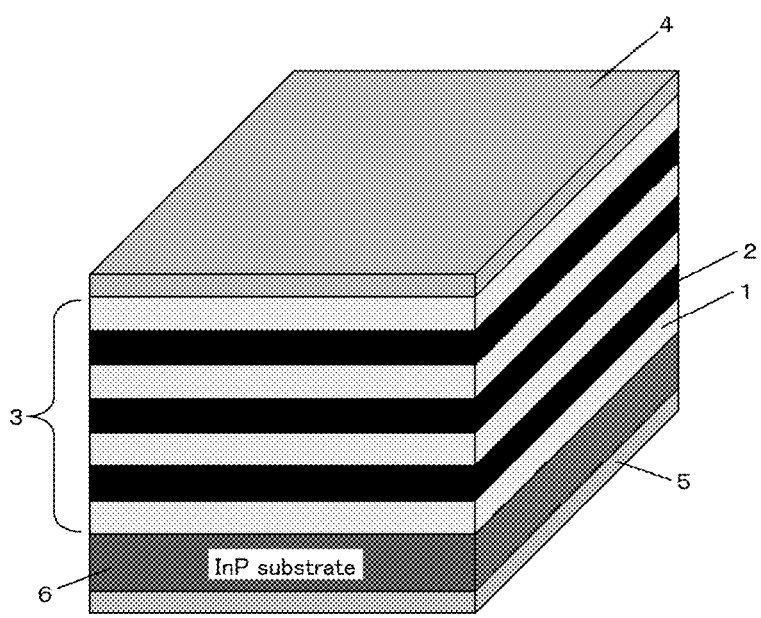
FIG. 5 is a schematic perspective view illustrating the configuration of the thermoelectric conversion device and the method of manufacturing the same according to the first embodiment.

In the present embodiment, as depicted in FIG. 5, the semiconductor stacked structure 3 is formed over a semiconductor substrate 6, and the positive electrode (upper electrode) 4 is formed over the upper face of the semiconductor stacked structure 3, whereas the negative electrode (lower electrode) 5 is formed over the back face of the semiconductor substrate 6.

As depicted in FIG. 1A, such a thermoelectric conversion device is provided between a heat-generating portion (higher-temperature portion) 7 and a cooling portion (heat-radiating portion; lower-temperature portion) 8, provided in an electronic apparatus, for example. More specifically, the thermoelectric conversion device is provided such that one electrode (positive electrode 4, in this embodiment) contacts the heat-generating portion 7 while the other electrode (negative electrode 5, in this embodiment) contacts the cooling portion 8. This configuration provides temperature gradient along the stacking direction of the semiconductor stacked structure 3. For example, when the heat-generating portion 7 and the cooling portion 8 are located on the top and the bottom of the stacked structure, respectively, temperature gradient is to be provided along a vertical direction.

Since charge carriers are electrons in the present embodiment, the material and the composition of each of the semiconductor layers 1 and 2 constructing the semiconductor stacked structure 3 are selected so as to avoid conduction-band discontinuity within the band structure, as depicted in FIG. 1B.

Figure 2A:
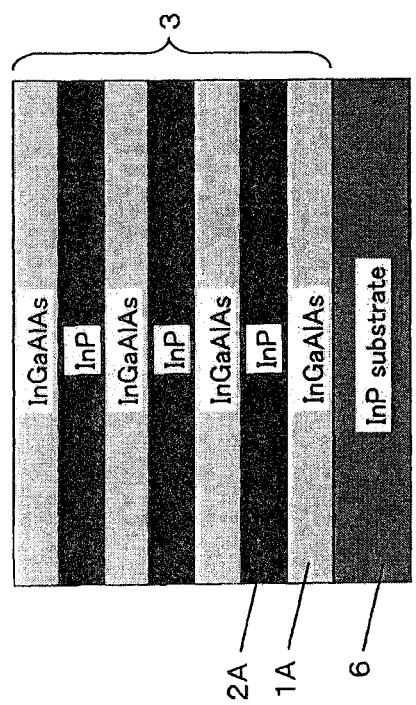
FIG. 2A is a schematic cross sectional view illustrating the configuration of the semiconductor stacked structure constructing the thermoelectric conversion device according to the first embodiment.
Figure 2B:
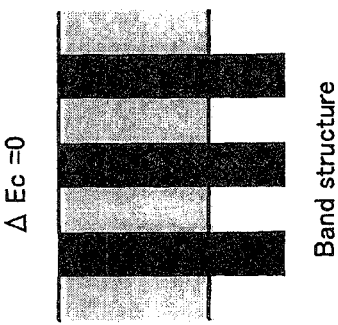
FIG. 2B is a diagram illustrating the band structure of the semiconductor stacked structure in FIG. 2A.

In this embodiment, the semiconductor stacked structure 3 is formed by staking an InGaAlAs layer 1A and an InP layer 2A alternately, for example, wherein the InGaAlAs and InP layers 1A and 2A being lattice-matched with each other, as depicted in FIG. 2A. More specifically, the semiconductor stacked structure 3 is formed by stacking two different semiconductor layers 1A and 2A having different band gaps, alternately. In the present embodiment, the semiconductor stacked structure 3 has a superlattice structure. As depicted in FIG. 2B, the compositions of the InGaAlAs layer 1A and the InP layer 2A are selected so as to avoid conduction-band discontinuity ($\Delta E_c = 0$). In the present embodiment, each semiconductor layer (here, InGaAlAs layer 1A and InP layer 2A) is preferably n-doped since charge carriers are electrons.

This configuration prevents carrier electrons from being blocked at the band edges (interfaces) between the semiconductor layers 1A and 2A, and thereby facilitating diffusion of the electrons from the plus (+) side to the minus (−) side, resulting in providing favorable electric conduction. In contrast, phonons are scattered at the interfaces between the semiconductor layers 1A and 2A, resulting in reducing the thermal conductivity. By utilizing the difference in the sizes of charge carriers and phonons, a significant increase in the figure of merit ZT can be attained, which has been very difficult to be achieved with conventional thermoelectric conversion devices utilizing a single material. In other words, the semiconductor stacked structure 3 formed by stacking a plurality of semiconductor layers 1A and 2A made from different semiconductor materials (in this embodiment, an artificial material having a superlattice structure) enables thermoelectric conversion devices with a higher conversion efficiency, which has been very difficult to be achieved with conventional natural single material.

Figure 3A:
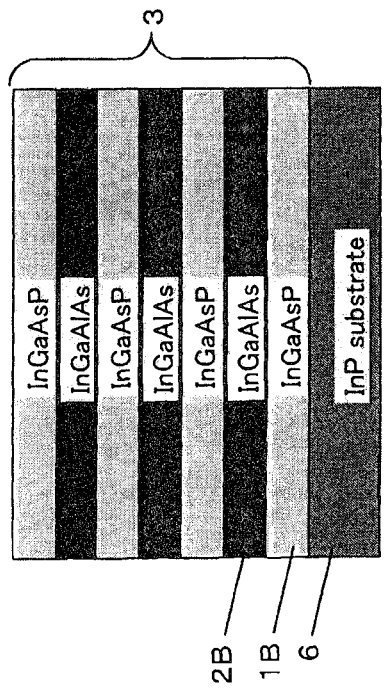
FIG. 3A is a schematic cross sectional view illustrating the configuration of the semiconductor stacked structure constructing a thermoelectric conversion device according to a variant of the first embodiment.
Figure 3B:
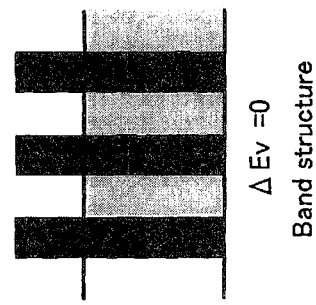
FIG. 3B is a diagram illustrating the band structure of the semiconductor stacked structure in FIG. 3A.

Although the materials and the compositions are selected so as to avoid conduction-band discontinuity in the present embodiment, this is not limiting. For example, when charge carriers are holes, the material and the composition of each of the semiconductor layers 1 and 2 constructing the semiconductor stacked structure 3 may be selected so as to avoid valence-band discontinuity. Specifically, the semiconductor stacked structure 3 may be formed by stacking an InGaAsP layer 1B and an InGaAlAs layer 2B alternately, for example, as depicted in FIG. 3A, and the compositions of the InGaAsP layer 1B and the InGaAlAs layer 2B may be selected so as to avoid valence-band discontinuity ($\Delta E_v = 0$), as depicted in FIG. 3B. In such a case, each semiconductor layer (here, InGaAsP layer 1B and InGaAlAs layer 2B) is preferably p-doped since charge carriers are holes. In addition, the material and the composition of each of the semiconductor layers 1 and 2 constructing the semiconductor stacked structure 3 may be selected so as to avoid conduction-band and valence-band discontinuities, for example. Stating differently, the material and the composition of each of the semiconductor layers 1 and 2 constructing the semiconductor stacked structure 3 may be selected so as to avoid conduction-band or valence-band discontinuity (discontinuity in at least one of the conduction or valence bands).

Furthermore, although the semiconductor stacked structure 3 is formed by staking two semiconductor layers 1 and 2 having different band gaps, alternately in the present embodiment, this is not limiting. For example, the semiconductor layers constructing the semiconductor stacked structure do not necessarily have different band gaps. Furthermore, the semiconductor stacked structure is not necessarily formed by staking two semiconductor layers alternately, and may be formed by staking semiconductor layers made from two or more different semiconductor materials (semiconductor materials made from different materials or having different compositions), for example.

Furthermore, although the semiconductor layers 1 and 2 constructing the semiconductor stacked structure 3 defines a superlattice structure in the present embodiment, this is not limiting and the semiconductor layers may be thicker and accordingly do not define a superlattice structure. However, forming thinner semiconductor layers to define a superlattice structure is preferred, since more interfaces are defined between semiconductor layers.

Furthermore, although the semiconductor layers 1 and 2 constructing the semiconductor stacked structure 3 are lattice-matched with each other in the present embodiment, this is not limiting and the semiconductor layers constructing the semiconductor stacked structure may be formed from semiconductor materials having different lattice constants. In such a case, the thickness of each semiconductor layer is preferably set to be equal to or smaller than the critical thickness. As used therein, the term "critical thickness" is the thickness of a semiconductor layer within which no lattice defect is generated in the semiconductor layer.

It should be noted that the semiconductor layers 1 (1A and 1B) and 2 (2A and 2B) constructing the semiconductor stacked structure 3 have the same thickness in the present embodiment (see FIGS. 1A, 2A, and 3A).

This is not limiting, however, and the semiconductor layers 1 and 2 constructing the semiconductor stacked structure 3 may have different thicknesses. In the present embodiment, the InGaAlAs layer 1A are preferably formed thicker than the InP layer 2A. More specifically, when the semiconductor stacked structure is formed from a semiconductor layer made from a quaternary compound semiconductor material and a semiconductor layer made from a binary compound semiconductor material, the quaternary compound semiconductor layer is preferably formed thicker than the binary compound semiconductor layer. This configuration can help to reduce the thermal conductivity.

Now, a method of manufacturing a thermoelectric conversion device according to this embodiment will be described with reference to FIGS. 4A-4C and 5.

Hereinafter, the present embodiment will be described with reference to an example wherein charge carriers are electrons, and accordingly a superlattice structure made from InGaAlAs layer 1A and InP layer 2A is formed as a semiconductor stacked structure 3.

Figure 4A:
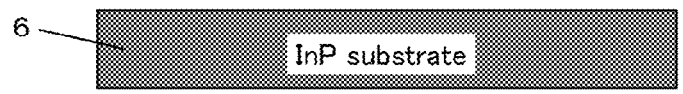
FIGS. 4A-4C are schematic cross-sectional views illustrating a method of manufacturing the thermoelectric conversion device according to the first embodiment.

Firstly, as depicted in FIG. 4A, an InP substrate (semiconductor substrate) 6 is provided as a base for forming the superlattice structure 3 thereover.

Figure 4B:
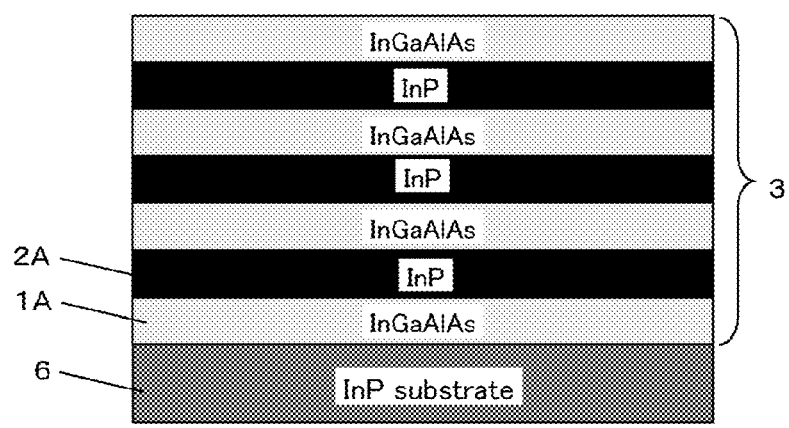

Subsequently, as depicted in FIG. 4B, an InGaAlAs layer 1A and an InP layer 2A, lattice-matched with each other, are stacked alternately above the InP substrate 6 by metal organic chemical vapor deposition (MOCVD), for example, to form a InP/InGaAlAs superlattice structure (semiconductor stacked structure) 3.

Material gases of trimethylindium (TMI, indium source), trimethylgallium (TMG, gallium source), trimethylaluminum (TMA, aluminum source), tertiarybutylarsine (TBA, arsenic source), and tertiarybutylphosphine (TBP, phosphorus source) may be used in the MOCVD, for example. The composition of a wavelength of approximately 1.15 µm is selected for the InGaAlAs layer 1A, while the composition of a wavelength of approximately 0.92 µm is selected for the InP layer 2A so as to avoid conduction-band discontinuity within the band structure between an InGaAlAs layer 1A and an InP layer 2A. Since the charge carriers contributing to the electric conduction are electrons in the present embodiment, the layers 1A and 2A are preferably n-doped.

Figure 4C:
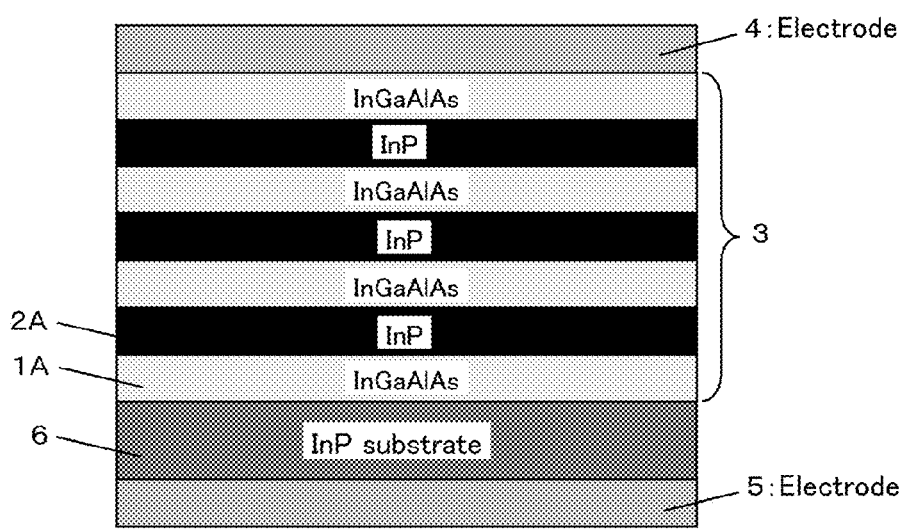

Subsequently, as depicted in FIG. 4C, metals (e.g., Ti/Au, AuGe/Au and the like) are formed on the surface (stack surface; upper face) of the superlattice structure 3 and the back face of the InP substrate 6, respectively, by evaporation, for example, as an upper electrode 4 and a lower electrode 5, respectively, thereby to fabricate a thermoelectric conversion device having the superlattice structure 3, as depicted in FIG. 5.

Alternatively, when charge carriers are holes and a superlattice structure made from InGaAsP layer 1B and InGaAlAs layer 2B is formed as a semiconductor stacked structure 3, an InGaAsP layer 1B and an InGaAlAs layer 2B are formed alternately above an InP substrate 6 by MOCVD, for example. In this case, the composition of a wavelength of approximately 1.3 µm is selected for the InGaAsP layer 1B, while the composition of a wavelength of approximately 1.0 µm or lower is selected for the InGaAlAs layer 2B is selected so as to avoid valence-band discontinuity within the band structure between an InGaAsP layer 1B and an InGaAlAs layer 2B. In addition, since the charge carries contributing to the electric conduction are holes in the present embodiment, the layers 1B and 2B are preferably p-doped.

As described above, the thermoelectric conversion device and a method of manufacturing the same according to the present embodiment are advantageous in that a thermoelectric conversion device exhibiting a higher conversion efficiency can be achieved.

Second Embodiment

Next, a thermoelectric conversion device and a method of manufacturing the same according to a second embodiment will be described with reference to FIGS. 6-11C.

Figure 6:
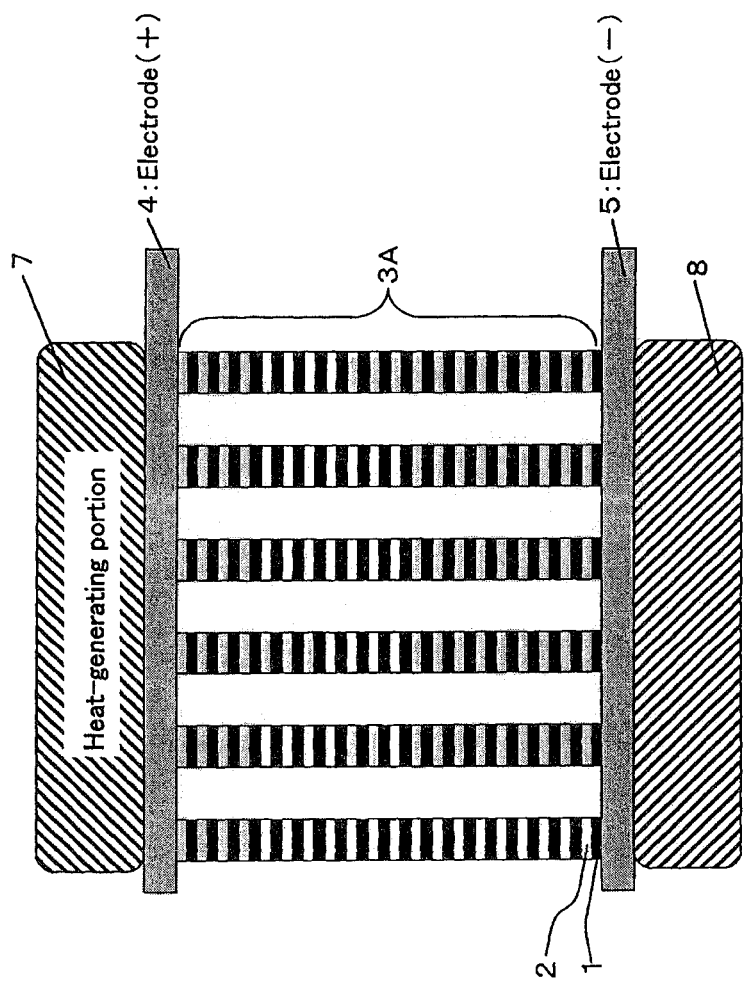
FIG. 6 is a schematic view illustrating the configuration of a thermoelectric conversion device according to a second embodiment.
Figure 7:
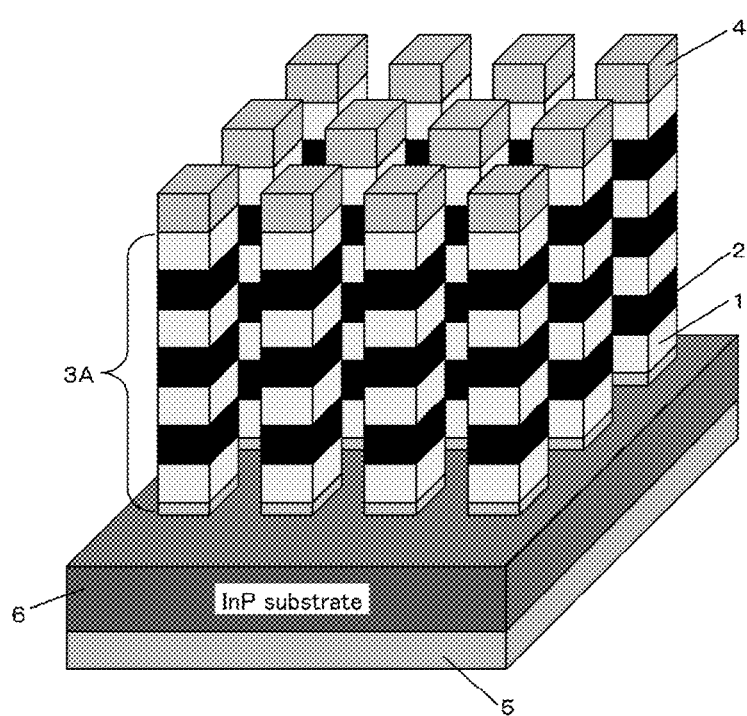
FIG. 7 is a schematic perspective view illustrating one example of the configuration of the thermoelectric conversion device (having wire-shaped semiconductor stacked structures) according to the second embodiment.
Figure 8:
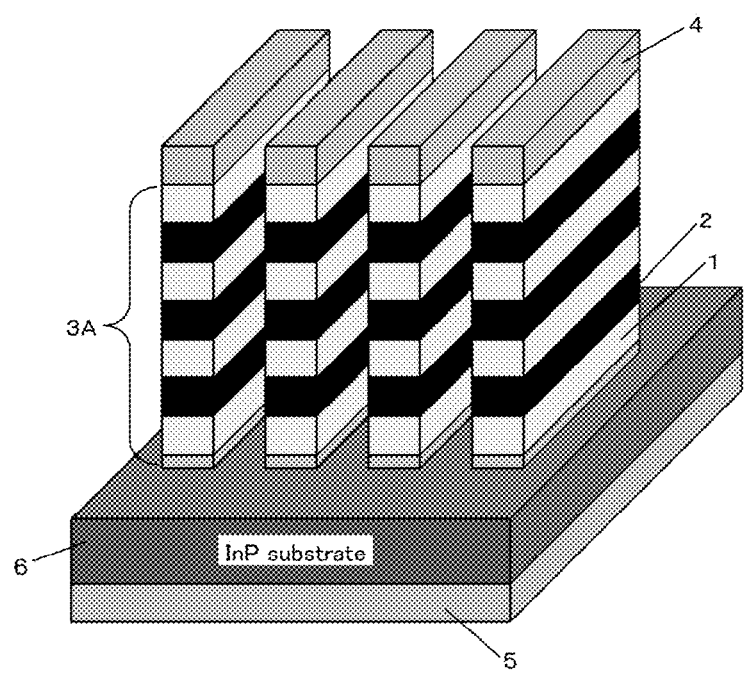
FIG. 8 is a schematic perspective view illustrating another example of the configuration of the thermoelectric conversion device (having mesa-shaped semiconductor stacked structures) according to the second embodiment.

The thermoelectric conversion device and the method of manufacturing the same according to the present embodiment are different from those in the above-described first embodiment and variants thereof (see FIGS. 1A and 5) in that a plurality of semiconductor stacked structures 3A in mesa shape (stripe shape) or wire shape (pillar shape) are provided as the semiconductor stacked structures, as depicted in FIGS. 6, 7, and 8.

More specifically, interfaces between the semiconductor layers 1 and 2 constructing the semiconductor stacked structure 3 are utilized for increasing phonon scattering in the above-described first embodiment. In the second embodiment, a plurality of mesa- or wire-shaped semiconductor stacked structures 3A are provided as semiconductor stacked structures, as depicted in FIGS. 6, 7, and 8, in order to increase phonon scattering by utilizing the surfaces (sides) of the semiconductor stacked structures 3A, in addition to the interfaces between the semiconductor layers 1 and 2 (i.e., to increase the surface areas), thereby attaining a higher figure of merit ZT. Note that, in FIGS. 6, 7, and 8, the same elements as in the above-described first embodiment (see FIGS. 1A and 5) are referenced by the like reference symbols.

In the present embodiment, mesa- or wire-shaped semiconductor stacked structures 3A extending in the direction of the semiconductor stack have a shortest cross sectional distance of approximately 1 μm or shorter. (The term "shortest cross sectional distance" represents the diameter if the cross-sectional shape of the stacked structures is a circle, or the minor axis diameter if the cross-sectional shape is an ellipse, or the length of short side if cross-sectional shape is a square). In other words, the mesa- or wire-shaped semiconductor stacked structures 3A are formed by setting the shortest cross sectional distance to be sufficiently small with respect to the height of the stacked structures 3A (i.e., by setting the shortest cross sectional distance to be equal to or smaller than the height).

Particularly, in order to increase phonon scattering, the mesa- or wire-shaped semiconductor stacked structures 3A preferably have a cross sectional area of approximately 1 μm$^2$ or smaller. In other words, forming wire-shaped semiconductor stacked structures 3A having a sufficiently small cross sectional area with respect to the height of the stacked structures 3A (i.e., setting the perimeter length of the cross section to be equal to or smaller than the height) is preferred. In this case, the surface areas increase, resulting in an improvement in the figure of merit ZT. A thermoelectric conversion device having wire-shaped semiconductor stacked structures 3A has a reduced output with respect to device size, and accordingly, is suitable for applications requiring excellent conversion efficiencies but not requiring a higher output. Note that the semiconductor stacked structures 3A have superlattice structures in this embodiment, and a thermoelectric conversion device having such superlattice structures are referred as a thermoelectric conversion device having nanowire superlattices (superlattice wire structures).

Hereinafter, a method of forming wire-shaped InP/InGaAlAs superlattice structures 3A (see FIGS. 6 and 7) will be described with reference to FIG. 9.

Firstly, a thermoelectric conversion device having an InP/InGaAlAs superlattice structure 3, an upper electrode 4, and a lower electrode 5 is fabricated in the manner similar to the above-described first embodiment (see FIGS. 4A-4C and 5).

Figure 9:
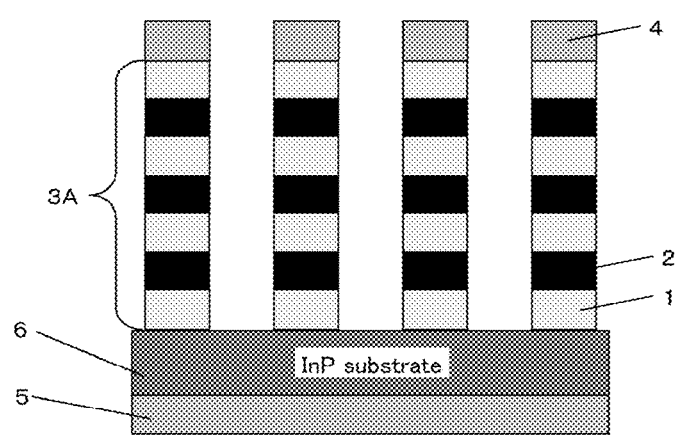
FIG. 9 is a schematic cross-sectional illustrating a method of manufacturing the thermoelectric conversion device according to the second embodiment.

Next, the InP/InGaAlAs superlattice structure (semiconductor stacked structure) 3 and the upper electrode 4 are processed into a wire shape by etching certain portions of the InP/InGaAlAs superlattice structure 3 and the upper electrode 4, by means of photolithography and Ar milling or inductively coupled plasma (ICP) dry etching using SiCl$_4$, as depicted in FIG. 9, for example. This results in fabrication of a thermoelectric conversion device having a plurality of wire-shaped InP/InGaAlAs superlattice structures (semiconductor stacked structures) 3A, as depicted in FIG. 7. It should be noted that spaces between the plurality of wire-shaped InP/InGaAlAs superlattice structures (semiconductor stacked structures) 3A are not filled in the present embodiment.

Alternatively, in order to form a plurality of mesa-shaped semiconductor stacked structures 3A, certain portions of the InP/InGaAlAs superlattice structures (semiconductor stacked structures) 3 and the upper electrode 4 may be etched to process them into a mesa shape.

Note that the method of forming the wire-shaped InP/InGaAlAs superlattice structures 3A (see FIGS. 6 and 7) is not limited to the one described above, and the following steps may be used alternatively.

Figure 10A:
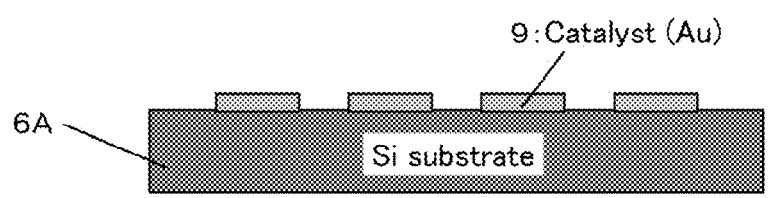
FIGS. 10A and 10B are schematic cross-sectional views illustrating a method of manufacturing a thermoelectric conversion device according to a variant of the second embodiment.

Firstly, as depicted in FIG. 10A, catalyst layers (e.g., layers made from Au) 9, which are to be used as underlying layers (base point) for forming wire-shaped InP/InGaAlAs superlattice structures 3A thereover in the subsequent steps, are formed, by photolithography, at a plurality of predetermined positions on an Si substrate (semiconductor substrate) 6A, for example.

Figure 10B:
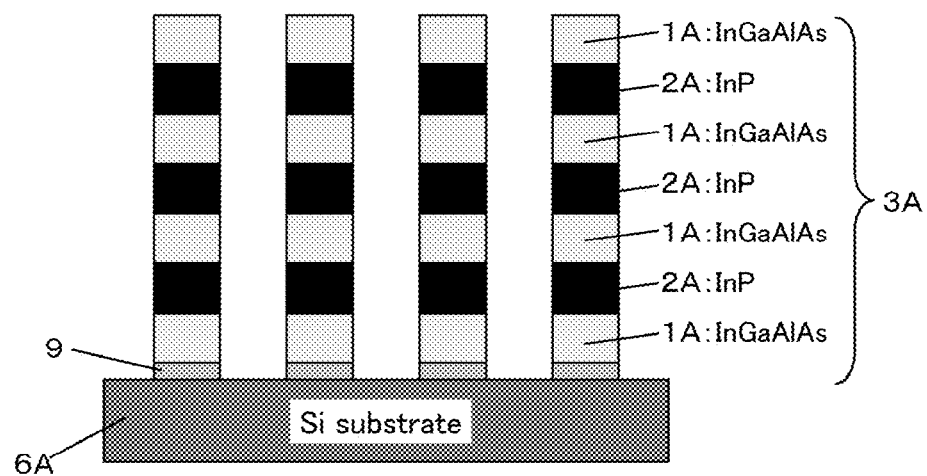

Subsequently, as depicted in FIG. 10B, an InGaAlAs layer 1A and an InP layer 2A are stacked over a plurality of Au layers 9 alternately, by MOCVD, for example, to form a plurality of wire-shaped InP/InGaAlAs superlattice structures (semiconductor stacked structures) 3.

Material gases of trimethylindium (TMI, indium source), trimethylgallium (TMG, gallium source), trimethylaluminum (TMA, aluminum source), tertiarybutylarsine (TBA, arsenic source), and tertiarybutylphosphine (TBP, phosphorus source) may be used in the MOCVD, for example. In addition, the composition of a wavelength of approximately 1.15 μm is selected for the InGaAlAs layer 1A, while the composition of a wavelength of approximately 0.92 μm is selected for the InP layer 2A so as to avoid conduction-band discontinuity within the band structure between an InGaAlAs layer 1A and an InP layer 2A. Since the charge carries contributing to the electric conduction are electrons in the present embodiment, the layers 1A and 2A are preferably n-doped.

Figure 11A:
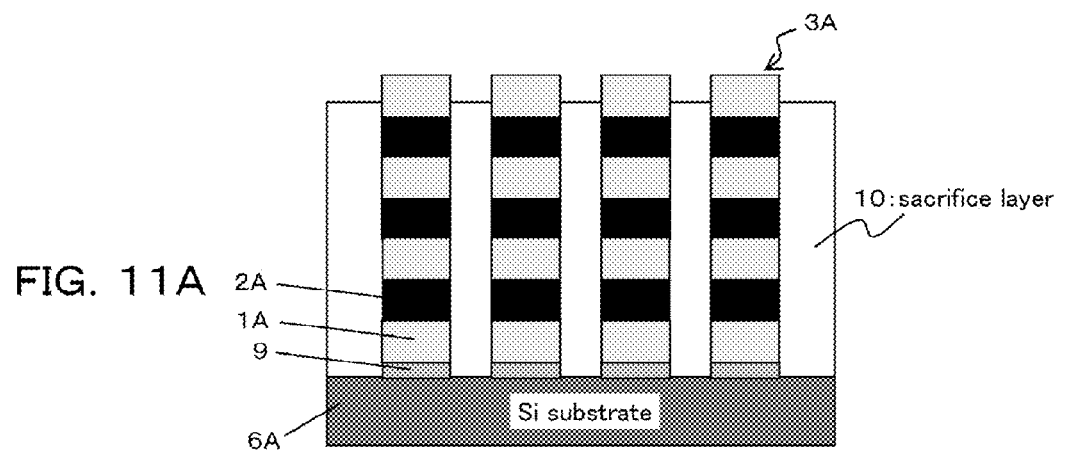
FIGS. 11A, 11B and 11C are schematic cross-sectional views illustrating the method of manufacturing the thermoelectric conversion device according to the variant of the second embodiment.

Subsequently, as depicted in FIG. 11A, a sacrifice layer 10 is formed over the entire surface using a photoresist, for example, and the top surface of each wire-shaped InP/InGaAlAs superlattice structure 3A is exposed by etching, for example.

Figure 11B:
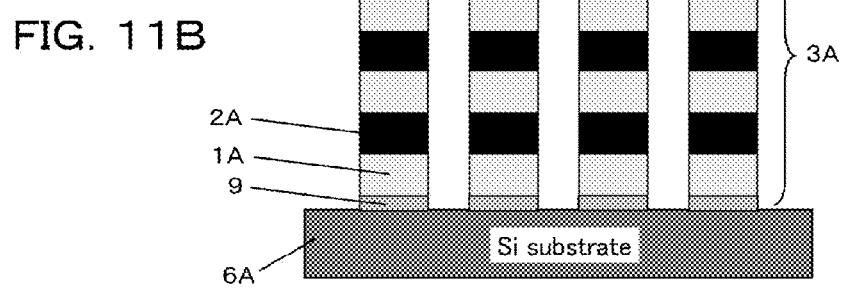

Subsequently, as depicted in FIG. 11B, a metal (e.g., Ti/Au, AuGe/Au and the like) is formed on the surfaces (upper faces) of the superlattice structures 3A by evaporation, for example, as upper electrodes 4, and then the sacrifice layer 10 is removed.

Figure 11C:
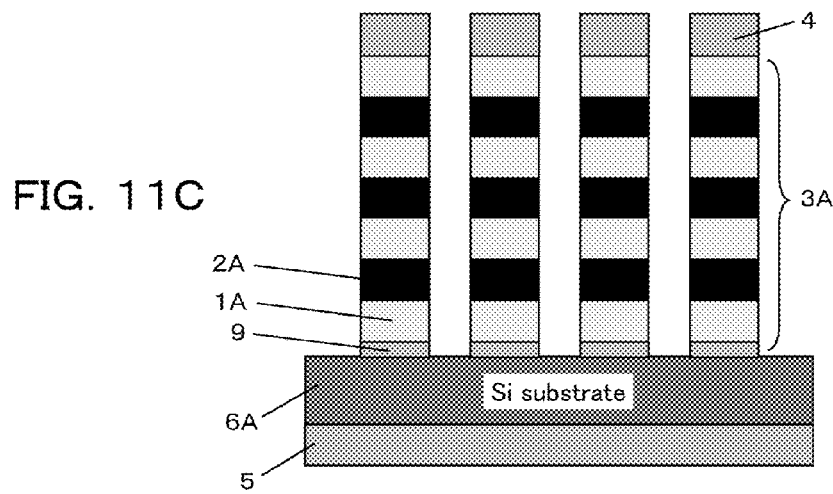

Subsequently, as depicted in FIG. 11C, a metal (e.g., Ti/Au, AuGe/Au and the like) is formed on the back face of the Si substrate 6A by evaporation, for example, as a lower electrode 5. In this manner, a thermoelectric conversion device having the plurality of wire-shaped InP/InGaAlAs superlattice structures 3A (see FIG. 6) is fabricated. In this case, the thermoelectric conversion device has the catalyst layer 9 between the semiconductor substrate 6A and the semiconductor stacked structures 3A, as depicted in FIG. 11C.

In order to form a plurality of mesa-shaped semiconductor stacked structures 3A, catalyst layers (e.g., layers made from Au) 9, which are to be used as underlying layers (base points) for forming mesa-shaped InP/InGaAlAs superlattice structures 3A thereover, may be formed at a plurality of positions.

Figure 12:
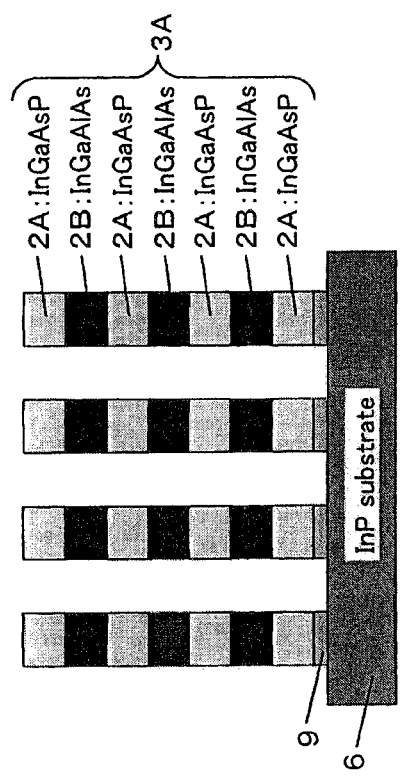
FIG. 12 is a schematic cross-sectional view illustrating a method of manufacturing a thermoelectric conversion device according to another variant of the second embodiment.

In addition, although the present embodiment has been described with respect to the method of forming wire-shaped InP/InGaAlAs superlattice structures 3A (see FIGS. 9 and 11C), wire-shaped InGaAsP/InGaAlAs superlattice structures 3A can be formed similarly. In order to form wire-shaped InGaAsP/InGaAlAs superlattice structures 3A using catalyst layers 9, for example, a plurality of wire-shaped InGaAsP/InGaAlAs superlattice structures (semiconductor stacked structures) 3A may be formed by stacking an InGaAsP 2A and an InGaAlAs 2B alternately over a plurality of Au layers 9 as catalyst layers by MOCVD, for example, as depicted in FIG. 12.

The description of other details is omitted since they are the same as those in the above-described first embodiment and variants thereof.

As described above, the thermoelectric conversion device and a method of manufacturing the same according to the present embodiment are advantageous in that a thermoelectric conversion device exhibiting a higher conversion efficiency can be achieved, like the above-described first embodiment. Especially, provision of a plurality of mesa- or wire-shaped semiconductor stacked structures 3A as semiconductor stacked structures enables an even higher figure of merit ZT, resulting in achieving a thermoelectric conversion device exhibiting an even higher conversion efficiency.

Third Embodiment

Next, an electronic apparatus according to a third embodiment will be described with reference to FIG. 13.

Figure 13:
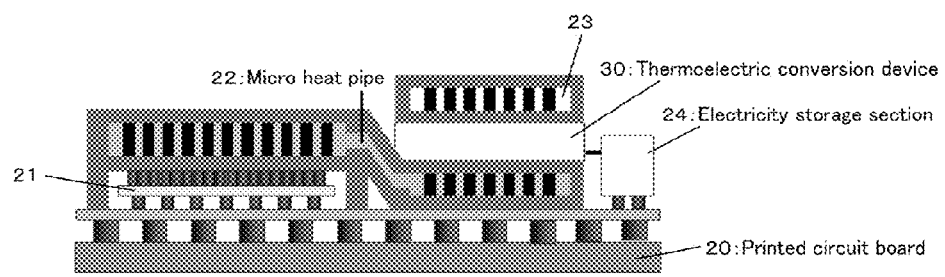
FIG. 13 is a schematic view illustrating a configuration of an electronic apparatus according to a third embodiment.
Figure 14:
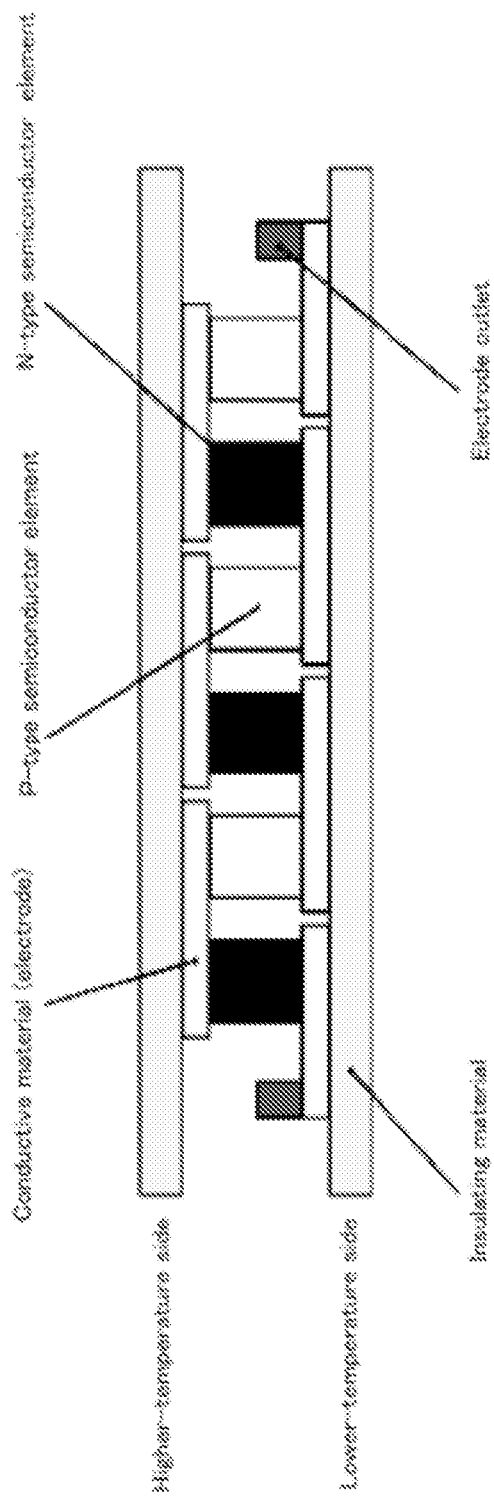
FIG. 14 is a schematic view illustrating a configuration of a conventional thermoelectric conversion device.

As depicted in FIG. 13, the electronic apparatus according to the present embodiment includes a CPU chip (heat-generating portion; higher-temperature portion) 21 mounted over a printed circuit board 20, micro heat pipes (heat-generating portion; higher-temperature portion) 22 provided in contact with the CPU chip 21, a cooling portion (heat-radiating portion; lower-temperature portion) 23, and an electricity storage section 24, for example.

In the present embodiment, a thermoelectric conversion device 30 according to any of the above-described first and second embodiments and their variants (see FIGS. 1A, 1B, and 6) is applied to the electronic apparatus. More specifically, as depicted in FIG. 13, a thermoelectric conversion device 30 according to any of the above-described first and second embodiment and their variants is disposed between the heat-generating portions 21 and 22 and the cooling portion 23 of this electronic apparatus. Thus, this electronic apparatus includes the thermoelectric conversion device 30 according to any of the above-described first and second embodiments and their variants (see FIGS. 1A, 1B, and 6), the heat-generating portions (higher-temperature portions) 21 and 22, and the cooling portion (heat-radiating portion; lower-temperature portion) 23, wherein the thermoelectric conversion device 30 is disposed between the heat-generating portions 21 and 22 and the cooling portion 23.

In such a case, the thermoelectric conversion device 30 is disposed such that one of the upper electrode 4 and the lower electrode 5 (see FIGS. 1A, 1B, and 6) of the thermoelectric conversion device 30 contacts the heat-generating portions 21 and 22 in the electronic apparatus, while the other electrode contacts the cooling portion 23 in the electronic apparatus. This configuration provides temperature gradient along the stacking direction of the semiconductor stacked structure(s). In this case, since the heat-generating portions 21 and 22 and the cooling portion 23 are located on the top and the bottom of the stacked structure (s), respectively, temperature gradient is to be provided along a vertical direction.

The description of the rest of configuration of the thermoelectric conversion device 30 or the method of manufacturing the same is omitted since they are the same as those in the above-described first and second embodiments and variants thereof.

As described above, the electronic apparatus according to the present embodiment is advantageous in that an electronic apparatus having a thermoelectric conversion device exhibiting a higher conversion efficiency can be achieved, like the above-described first and second embodiments.

Although the above-described third embodiment has been described in the context in which the thermoelectric conversion device 30 according to any of the above-described first and second embodiments and their variant (see FIGS. 1A, 1B, and 6) is applied to an electronic apparatus having a CPU chip 21, this is not limiting. For example, the thermoelectric conversion device according to any of the above-described first and second embodiments and their variants (see FIGS. 1A, 1B, and 6) can be applied to an electronic apparatus having an electronic device as a heat-generating source, such as high-power high-frequency power amplifiers and driver modules for electric vehicles and so forth. The thermoelectric conversion device provides thermoelectric conversion by utilizing the electronic device generating heat. The thermoelectric conversion device according to any of the above-described first and second embodiments and their variants (see FIGS. 1A, 1B, and 6) can also be applied to an electronic apparatus for utilizing waste heat, such as thermal power plant, server systems, and body temperature, for example.

[Others]

Although the semiconductor layers constructing a semiconductor stacked structure are made from InP/InGaAlAs or InGaAsP/InGaAlAs in the above-described embodiments and their variants, this is not limiting and other combinations of semiconductor layers, such as GaN/InGaN, may be used, for example. An appropriate combination of semiconductor layers in a semiconductor stacked structure may be suitably selected depending on the operating temperature range, for example. For example, for higher-temperature applications, semiconductor layers constructing a semiconductor stacked structure are preferably made from GaN/InGaN.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A thermoelectric conversion device comprising:
a semiconductor stacked structure including semiconductor layers stacked with each other,
wherein the semiconductor stacked structure includes InGaAlAs layers and InP layers stacked alternately as the semiconductor layers, and the compositions of the InGaAlAs and InP layers are selected such that the energy difference in conduction-bands between the InGaAlAs and InP layers is exactly zero, or the semiconductor stacked structure includes InGaAsP layers and InGaAlAs layers stacked alternately as the semiconductor layers, and the compositions of the InGaAsP and InGaAlAs layers are selected such that the energy difference in valence-bands between the InGaAsP and InGaAlAs layers is exactly zero, and
the thermoelectric conversion device is a thermoelectric conversion device wherein one side in a stacking direction of the semiconductor stacked structure is coupled to a heat-generating portion and the other side in the stacking direction of the semiconductor stacked structure is coupled to a cooling portion.

2. The thermoelectric conversion device according to claim 1, wherein the semiconductor stacked structure has a superlattice structure.

3. The thermoelectric conversion device according to claim 1, wherein the semiconductor layers in the semiconductor stacked structure are lattice-matched with each other.

4. The thermoelectric conversion device according to claim 1, wherein the semiconductor layers in the semiconductor stacked structure have a same thickness.

5. The thermoelectric conversion device according to claim 1, wherein the semiconductor layers in the semiconductor stacked structure have different thicknesses.

6. The thermoelectric conversion device according to claim 1, wherein the semiconductor stacked structure has a mesa or wire shape.

7. The thermoelectric conversion device according to claim 6, wherein the semiconductor stacked structure having the mesa or wire shape has a shortest cross sectional distance of 1 μm or smaller.

8. The thermoelectric conversion device according to claim 6, wherein the semiconductor stacked structure having the mesa or wire shape has a cross sectional area of 1 µm² or smaller.

9. The thermoelectric conversion device according to claim 1, wherein the semiconductor stacked structure is formed over a semiconductor substrate, and the thermoelectric conversion device further comprises:
an upper electrode provided over an upper face of the semiconductor stacked structure; and
a lower electrode provided over a back face of the semiconductor substrate.

10. The thermoelectric conversion device according to claim 9, further comprising a catalyst layer between the semiconductor substrate and the semiconductor stacked structure.

11. An electronic apparatus comprising:
a thermoelectric conversion device including a semiconductor stacked structure, wherein the semiconductor stacked structure includes InGaAlAs layers and InP layers stacked alternately, and the compositions of the InGaAlAs and InP layers are selected such that the energy difference in conduction-bands between the InGaAlAs and InP layers is exactly zero, or the semiconductor stacked structure includes InGaAsP layers and InGaAlAs layers stacked alternately, and the compositions of the InGaAsP and InGaAlAs layers are selected such that the energy difference in valence-bands between the InGaAsP and InGaAlAs layers is exactly zero;
a heat-generating portion coupled to one side in a stacking direction of the semiconductor stacked structure included in the thermoelectric conversion device; and
a cooling portion coupled to the other side in the stacking direction of the semiconductor stacked structure included in the thermoelectric conversion device.

12. The electronic apparatus according to claim 11, wherein the semiconductor stacked structure is formed over a semiconductor substrate, and the thermoelectric conversion device further comprises:
an upper electrode provided over an upper face of the semiconductor stacked structure; and
a lower electrode provided over a back face of the semiconductor substrate, one of the upper and lower electrodes being coupled to the heat-generating portion and the other of the upper and lower electrodes being coupled to the cooling portion.

13. A method of manufacturing a thermoelectric conversion device, comprising:
forming a semiconductor stacked structure by stacking an InGaAlAs layer and an InP layer alternately over a semiconductor substrate, the compositions of the InGaAlAs and InP layers being selected such that the energy difference in conduction-bands between the InGaAlAs and InP layers is exactly zero, or forming a semiconductor stacked structure by stacking an InGaAsP layer and an InGaAlAs layer alternately over a semiconductor substrate, the compositions of the InGaAsP and InGaAlAs layers being selected such that the energy difference in valence-bands between the InGaAsP and InGaAlAs layers is exactly zero; and
forming an upper electrode over an upper face of the semiconductor stacked structure and forming a lower electrode over a back face of the semiconductor substrate, one of the upper and lower electrodes being coupled to a heat-generating portion and the other of the upper and lower electrodes being coupled to a cooling portion.

14. The method of manufacturing a thermoelectric conversion device according to claim 13, further comprising processing the upper electrode and the semiconductor stacked structure into a mesa or wire shape after the forming the upper and lower electrodes.

15. The method of manufacturing a thermoelectric conversion device according to claim 13, further comprising forming a catalyst layer over the semiconductor substrate,
wherein the constructing the semiconductor stacked structure comprising constructing the semiconductor stacked structure having a mesa or wire shape by stacking the InGaAlAs layer and the InP layer alternately or by stacking the InGaAsP layer and the InGaAlAs layer alternately over the catalyst layer, and
the forming the upper and lower electrodes comprises forming the upper electrode over the upper face of the semiconductor stacked structure having the mesa or wire shape and forming the lower electrode over the back face of the semiconductor substrate.

\* \* \* \* \*